(12) United States Patent
Kraus et al.

(10) Patent No.: US 8,953,145 B2
(45) Date of Patent: Feb. 10, 2015

(54) DETECTION OF CONTAMINATING SUBSTANCES IN AN EUV LITHOGRAPHY APPARATUS

(75) Inventors: Dieter Kraus, Oberkochen (DE); Dirk Heinrich Ehm, Lauchheim (DE); Stefan-Wolfgang Schmidt, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 480 days.

(21) Appl. No.: 13/035,056

(22) Filed: Feb. 25, 2011

(65) Prior Publication Data

US 2011/0211179 A1 Sep. 1, 2011

Related U.S. Application Data

(63) Continuation of application No. PCT/EP2009/004811, filed on Jul. 3, 2009.

(60) Provisional application No. 61/092,251, filed on Aug. 27, 2008.

(30) Foreign Application Priority Data

Aug. 27, 2008 (DE) .......................... 10 2008 041 592

(51) Int. Cl.
  *G03B 27/42* (2006.01)
  *G03F 7/20* (2006.01)
(52) U.S. Cl.
  CPC .......... *G03F 7/70916* (2013.01); *G03F 7/7085* (2013.01); *G03F 7/70983* (2013.01)
  USPC .................................. 355/53; 355/63; 355/77
(58) Field of Classification Search
  USPC ........... 355/30, 53, 63, 65, 67, 77; 250/492.1; 73/23.2
  See application file for complete search history.

(56) References Cited

U.S. PATENT DOCUMENTS 6,803,161 B2 10/2004 Shirasaki
7,212,273 B2 5/2007 Terashima
(Continued)

FOREIGN PATENT DOCUMENTS

DE 102005062430 A1 7/2007
DE 102006036488 A1 2/2008
(Continued)

OTHER PUBLICATIONS

Chinese Office Action in parallel Chinese case 2009-80133665.7, dated Aug. 14, 2012.
(Continued)

*Primary Examiner* — Steven H Whitesell Gordon
*Assistant Examiner* — Mesfin T Asfaw
(74) *Attorney, Agent, or Firm* — Edell, Shapiro & Finnan, LLC (57) ABSTRACT

An EUV (extreme ultraviolet) lithography apparatus (1) including: a housing (1a) enclosing an interior (15), at least one reflective optical element (5, 6, 8, 9, 10, 14.1 to 14.6) arranged in the interior (15), a vacuum generating unit (1b) generating a residual gas atmosphere in the interior (15), and a residual gas analyzer (18a, 18b) detecting at least one contaminating substance (17a) in the residual gas atmosphere. The residual gas analyzer (18a) has a storage device (21) having an ion trap for storing the contaminating substance (17a). Additionally, a method for detecting at least one contaminating substance by residual gas analysis of a residual gas atmosphere of an EUV lithography apparatus (1) having a housing (1a) having an interior (15), in which at least one reflective optical element (5, 6, 8, 9, 10, 14.1 to 14.6), is arranged, wherein the contaminating substance (17a) is stored in a storage device (21) in order to carry out the residual gas analysis.

29 Claims, 3 Drawing Sheets

(56) References Cited

U.S. PATENT DOCUMENTS

| | | | |
|---|---|---|---|
| 2003/0076602 A1 | 4/2003 | Nishikawa | |
| 2003/0211628 A1 | 11/2003 | Griffey et al. | |
| 2007/0028669 A1 | 2/2007 | Brewster | |
| 2007/0054497 A1 | 3/2007 | Weiss et al. | |
| 2007/0138414 A1 | 6/2007 | Stevens et al. | |
| 2007/0140910 A1 | 6/2007 | Banine et al. | |
| 2007/0143032 A1 | 6/2007 | Wieringa et al. | |
| 2008/0128636 A1 | 6/2008 | Koster et al. | |
| 2008/0143981 A1* | 6/2008 | Ehm et al. | 355/30 |
| 2010/0112494 A1 | 5/2010 | Kraus et al. | |

FOREIGN PATENT DOCUMENTS

| | | |
|---|---|---|
| DE | 102007057252 A1 | 9/2008 |
| JP | 2007506903 A | 3/2007 |
| JP | 2007173804 A | 7/2007 |
| JP | 2007173805 A | 7/2007 |
| WO | 2006039161 A2 | 4/2006 |
| WO | 2008034582 A2 | 3/2008 |
| WO | 2008063056 A2 | 5/2008 |

OTHER PUBLICATIONS

ISOLTRAP, http://isoltrap.web.cern.ch/isoltrap/ Feb. 2, 2011.

Dissertation of Dr. Alexander Kohl, "Direct mass determination in the vicinity of lead and examination of a Stark effect in the Penning trap", University of Heidelberg, 1999.

Dissertation of Dr. Juergen Benno Neumayr, "The buffer gas cell and the extraction RFQ for SHIPTRAP", LMU Munich, Dept. of Phsyics, Apr. 28, 2004.

Chinese Office Action corresponding to Chinese Patent Application No. 2013050600617140, dated May 9, 2013 (translation).

Chinese Office Action corresponding Chinese Patent Application No. 200980133665.7, dated Nov. 18, 2013 (translation).

Japanese Office Action corresponding to Japanese Patent Application No. 2011-524210, dated Mar. 5, 2013 (translation).

English Translation of Office Action in counterpart Korean Application No. Oct. 2011-7004618, mailed Apr. 29, 2014 (6 pages).

English Translation of Office Action in counterpart Japanese Application No. 2011-524210, mailed Jul. 29, 2014 (4 pages).

Naito Y. et al., "Mass Spectrometry Using Fourier Transform", J. Mass Spectrom. Soc. Jpn., vol. 42. No. 6, 1994 (pp. 291 et seq.).

English Translation of Office Action in counterpart Chinese Application No. 200980133665.7, mailed Jun. 3, 2014 (7 pages).

Hu Q. et al., "The Orbitrap: a new mass spectrometer." Journal of mass spectrometry 40.4 (2005): 430-443.

Wurm S., "EUV lithography development in the United States." 4th International EUVL Symposium Steering Committee, San Diego, CA. 2005.

\* cited by examiner

DETECTION OF CONTAMINATING SUBSTANCES IN AN EUV LITHOGRAPHY APPARATUS

CROSS-REFERENCE TO RELATED PATENT APPLICATIONS

This is a Continuation of International Application PCT/EP2009/004811, with an international filing date of Jul. 3, 2009, which was published under PCT Article 21(2) in English, which claims priority under 35 U.S.C. §119(a) to German Patent Application No. 10 2008 041 592.8, filed on Aug. 27, 2008, and the entire contents of which are hereby incorporated by reference; this application also claims the benefit under 35 U.S.C. §119(e)(1) of U.S. Provisional Application No. 61/092,251, filed on Aug. 27, 2008, the entire contents of which are also hereby incorporated by reference.

FIELD OF AND BACKGROUND OF THE INVENTION

The invention relates to an EUV (extreme ultraviolet) lithography apparatus, comprising: a housing enclosing an interior, at least one reflective optical element arranged in the interior, a vacuum generating unit for generating a residual gas atmosphere in the interior, and also a residual gas analyzer for detecting at least one contaminating substance in the residual gas atmosphere. The invention also relates to a method for detecting at least one contaminating substance by residual gas analysis of a residual gas atmosphere of an EUV lithography apparatus having a housing having an interior, in which at least one reflective optical element is arranged.

Reflective elements, in particular mirrors, are typically used as optical elements in EUV lithography apparatuses since there are no optical materials having a sufficiently high degree of transmission at the wavelengths used therein of approximately 13.5 nm. Operation of the mirrors under vacuum conditions, typically at (total) pressures of between $10^{-9}$ mbar and $10^{-1}$ mbar, is necessary in such projection exposure apparatuses because the lifetime of the multilayer mirrors is limited by contaminating substances. The contaminating substances are, inter alfa, heavy hydrocarbons in the gas phase, which are deposited on the mirror surfaces as solid carbon under irradiation with EUV light, whereby the reflectivity of the mirrors decreases.

The residual content of contaminating substances in the interior of the EUV lithography apparatus in which the optical elements are arranged should be determined as accurately as possible and in real time in order to define the point in time at which the exposure process in the EUV lithography apparatus can begin. At this point in time, the proportion of contaminating substances in the interior should lie below a predetermined limit value. The residual content of the contaminating substances can also be monitored during exposure operation, in order to be able to initiate suitable counter measures, if appropriate, in the event of an excessively large residual content, e.g. intensified pumping with a purge gas, in order that contaminating substances from the gas phase can deposit on the surfaces of the mirrors to the smallest possible extent.

In order to detect contaminations or contaminating substances in the gas phase, it is known from U.S. Pat. No. 7,212,273 B2 to use a quadrupole mass spectrometer to record a mass spectrum of the residual gas of an EUV lithography apparatus for gaseous substances between 40 and 200 atomic mass units. The ion current of the residual gas spectrum shown therein is not normalized, however, such that individual contaminating substances having extremely low partial pressures ($<10^{-14}$ mbar) or individual ions of said contaminating substances cannot be detected by means of the mass spectrometer described therein.

WO 2008/034582 A2 in the name of the applicant discloses the use of a calibration leak for the calibration of a residual gas analyzer for an EUV lithography apparatus, by means of which leak a constant inflow of an inner gas into the interior takes place. Relative to the leakage rate of the calibration leak, the residual gas analyzer can be calibrated and its function can be checked. For a precise calibration it is expedient if the inert gas has a mass-charge ratio which is close to that of the contaminating substances to be detected. Particularly if a plurality of contaminating substances having significantly different mass-charge ratios are intended to be detected, it may be necessary, therefore, to use a plurality of different inert gases for the calibration.

OBJECTS AND SUMMARY OF THE INVENTION

It is an object of the invention to provide an EUV lithography apparatus and also a method for detecting at least one contaminating substance which make it possible to detect even very small quantities of contaminating substances in particular including at high residual gas pressures.

This object is achieved, e.g., with an EUV lithography apparatus of the type mentioned in the introduction wherein the residual gas analyzer has a storage device for storing the contaminating substance. In contrast to the residual gas analyzers which are known from the prior art and in which the ionized contaminating substances pass through the electromagnetic fields of the quadrupole mass spectrometer only momentarily, without being stored in said fields, the provision of the storage device makes it possible to increase the detection sensitivity of the residual gas analyzer since the contaminating substance is available for measurement for a longer time. In this case, the residual gas analyzer or the storage cell can be provided in the housing of the EUV lithography apparatus or else be flanged to said housing.

In one preferred embodiment, the storage device is designed to accumulate the contaminating substance. The accumulation during the storage time makes it possible to increase the signal-to-noise ratio of the contaminating substances to be examined relative to further contaminating substances or the remaining residual gas, the noise behavior and/or the detection threshold of the detector used in the residual gas analyzer.

In a further preferred embodiment, the storage device is designed to isolate the contaminating substance from other substances contained in the residual gas atmosphere. In addition or as an alternative to the accumulation, it is possible to effect a preparation of the contaminating substance during the storage time, that is to say that the contaminating substance can be isolated from the other substances in the residual gas atmosphere and thereby be detected without this necessarily requiring an accumulation as well.

Preferably, the residual gas analyzer has an ionization device for ionizing the contaminating substance, in particular an electron gun or a laser, and an ion trap as storage device. Mass spectrometry can be carried out in the ion trap in order to detect the contaminating substance. Ion trap mass spectrometers are particularly well suited to the detection even of extremely low concentrations of contaminating substances. A heating element is generally used as the ionization device, but it is also possible to generate the ions by impact ionization, e.g. using an electron gun or a laser system. The ionization device can be arranged in the ion trap or embodied as a separate structural unit. Ion trap mass spectrometers generally operate discontinuously, that is to say that an analysis of the ion number can take place after a predetermined accumulation time. Ion trap mass spectrometers furthermore enable a multiple repetition of the ion excitation and mass selection, without a further assembly being required. In particular, in an ion trap it is also possible, if appropriate, to perform both an accumulation of the contaminating substance and a separation of the contaminating substance from further substances present in the residual gas atmosphere.

In one advantageous development, the ion trap is designed to detect the contaminating substance. The electrodes of the ion trap which are provided for generating an electric and/or magnetic (alternating) field can simultaneously also serve for detecting ions having specific atomic mass numbers by the determination of the alteration of the alternating field on account of the ions present in the ion trap.

In a particularly preferred embodiment, the residual gas analyzer has a mass filter for separating the contaminating substance from other substances in the residual gas atmosphere. The mass filter can be a conventional quadrupole filter for mass separation, but it is also possible, as an alternative, to use an ion trap for the (spatial) separation of ions having different mass numbers.

The ion trap is preferably selected from the group comprising: Fourier Transformation Ion Cyclotron Resonance (FT-ICR) trap, Penning trap, Paul trap, quadrupole ion trap, linear trap, Orbitrap, EBIT and RF Buncher. The FT-ICR trap constitutes a modification of the Penning trap in which the ions are injected into alternating electric fields and a static magnetic field. In the FT-ICR trap, mass spectrometry can be operated via cyclotron resonance excitation. In a modification thereof, the Penning trap can also be operated with an additional buffer gas, wherein, with the aid of the buffer gas in combination with a magnetron excitation using an electric dipole field and a cyclotron excitation using an electric quadrupole field, it is possible to produce a mass selection by spatial separation of the ions, such that the Penning trap can also be used for separating the contaminating substance from other substances. Since the buffer gas in this type of trap generally has a motion-damping and hence "cooling" effect on the entrapped ions, this type of trap is also referred to as a "cooler trap". The linear trap is a modification of the quadrupole trap or Paul trap in which the ions are not held in a three-dimensional quadrupole field but rather in a two-dimensional quadrupole field using an additional edge field, in order to increase the storage capacity of the ion trap. The so-called Orbitrap has a central, spindle-shaped electrode, around which the ions are kept on orbital paths by the electrical attraction, wherein a decentralized injection of the ions produces an oscillation along the axis of the central electrode, which generates in the detector plates signals that can be detected in a manner similar to that in the case of the FT-ICR trap. An EBIT (Electron Beam Ion trap) is an ion trap in which the ions are generated by impact ionization using an ion gun, wherein the ions generated in this way are attracted by the electron beam and trapped by the latter. The ions can also be stored in an RF ("radio frequency") Buncher, e.g. so-called RFQ (quadrupole) Buncher, see e.g. Neumayr, Juergen Benno (2004): "The buffer gas cell and the extraction RFQ for SHIPTRAP", Dissertation, LMU Munich: Faculty of Physics. It goes without saying that in addition to the types of traps presented above, it is also possible to use other types of ion traps for residual gas analysis.

In a further preferred embodiment, the storage device has a cooling unit for cooling a surface for freezing out or condensing the contaminating substance and preferably a heating unit for subsequently desorbing the contaminating substance from the surface. A thermal accumulation of the contaminating substance can take place in this way, wherein detection is achieved through rapid thawing or evaporation of the contaminating substance using the heating unit together with subsequent temperature controlled desorption spectroscopy of the evaporated or decomposed species (molecular fragments) method. In this case, thawing a cooling finger, e.g. a gas species frozen out or condensed in a targeted manner can be rapidly desorbed, which generates a partial pressure that is orders of magnitude higher than that partial pressure which prevails during operation of the EUV lithography apparatus given normal residual gas density with respect to the contaminating substance to be detected. In addition to the thawing of the cooling finger, it is also possible to bombard the latter using an electron gun (E-Gun) or using a laser in order to transfer the condensed or frozen-out contaminating substances for detection into the gas phase.

In a further advantageous embodiment, the cooling unit and/or the heating unit are/is connected to a control device for setting the temperature of the surface. The control device can serve for setting a temperature at the surface formed on a cooling finger, for example, at which the contaminating substance, e.g. a heavy hydrocarbon, but not the background gas itself is frozen out. The temperature at which the background gas freezes out or condenses is dependent on the condensation temperature of the background gas used, which is approximately 4.2 K in the case of helium, approximately 20.3 K in the case of hydrogen, approximately 87.2 K in the case of argon and approximately 120 K in the case of krypton. By choosing the temperature above these values, it is possible to effect a selective accumulation of the contaminating substance without impairment through the background gas. In order to avoid problems with substances such as water, for example, which is possibly present in a non-heated EUV lithography apparatus, the control or regulation can be used to correspondingly coordinate the thawing curve and wait longer at the associated known desorption temperatures e.g. of water.

In a further preferred embodiment, the storage device for accumulating the contaminating substance comprises a gas-binding material. The gas-binding material can be an absorber or a filter which passively takes up the contaminating substance. In a manner similar to that described above, the contaminating substance or the decomposition products thereof, that is to say molecular fragments of the contaminating substance to be detected, can be released by stimulated desorption (thermally or by irradiation), from the gas-binding material, in order then to be analyzed as strong outgassing. The gas-binding material can then be regenerated cyclically e.g. at a high temperature (in a separated (vacuum) region). It goes without saying that, instead of the desorption, if appropriate, a direct surface-physical analysis of the gas-binding material or of the cooled surface is also possible in order to detect the contaminating substance. The gas-binding material can also be cooled in order to accelerate the accumulation.

The EUV lithography apparatus preferably comprises a pump device for pumping the contaminating substance through the gas-binding material. in this case, an active accumulation is effected by conducting the residual gas through the gas-binding material as filter, wherein the gas-binding material preferably has a large surface area and is porous, in particular. One class of materials which meets these requirements is zeolites, for example.

In a particularly advantageous embodiment, the EUV lithography apparatus comprises an irradiation device, in particular an electron gun or a laser, for desorbing the contaminating substance from the gas-binding material and/or the coolable surface. Appropriate irradiation devices include, in particular, light sources or electron sources with the aid of which the contaminating substance can be removed from the gas-binding material and/or the coolable surface by nonthermal or, if appropriate, thermal desorption, Irrespective of the way in which the desorption is effected, it is possible, owing to the accumulation, for the subsequent detection of the contaminating substance to be effected by a conventional residual gas analysis, e.g. using a conventional quadrupole mass spectrometer.

Particularly preferably, the storage device is arranged in a pump channel outside the interior. The pump channel can serve for evacuating the housing or the interior or as an evacuation channel for the flow of a purge gas. However, the pump channel can also be part of a pump circuit in which the residual gas of the EUV lithography apparatus passes through a cleaning loop.

Particularly preferably, the residual gas analyzer has a controllable inlet for the pulsed leading of the contaminating substance into the storage device. In this case, a controllable inlet is understood to mean an inlet which can be opened or closed in a manner dependent on a control signal in order to be able to perform the detection of the contaminating substance in a pulsed sequence and/or to be able to perform the accumulation or desorption of the contaminating substance at predeterminable temporal intervals.

In one embodiment, the total pressure of the residual gas in the interior is more than $10^{-5}$ mbar, in particular more than $10^{-4}$ mbar. EUV lithography apparatuses are typically operated at comparatively high residual gas pressures that are generated by background gases, e.g. noble gases or hydrogen. At such background pressures, conventional residual gas analyzers fail if they are intended to detect small quantities of a further residual gas. With the aid of the storage device, even at a high total pressure, it is possible to effect a detection of contaminating substances even with very small partial pressures.

In a further embodiment, the partial pressure of the contaminating substance in the interior is less than $10^{-9}$ mbar, preferably less than $10^{-12}$ mbar, in particular less than $10^{-14}$ mbar. The detection of contaminating substances with such low partial pressures (with only a few hundred particles per $cm^2$) at a high residual gas pressure of the vacuum in the interior can also be effected in the manner described above.

A further aspect of the invention is realized in a method of the type mentioned in the introduction wherein the contaminating substance is stored in a storage device in order to carry out the residual gas analysis. As explained above, the contaminating substance can be accumulated and/or prepared in the storage device, that is to say be stored in such a way that it can be isolated from other substances contained in the residual gas atmosphere.

In one advantageous variant, the contaminating substance is firstly accumulated on a cooled surface of the storage device and is subsequently desorbed from the cooled surface for detection, wherein the temperature of the surface is preferably set in such a way that exclusively contaminating substances are taken up on the surface. The temperature of the cooled surface is ideally chosen in such a way that as far as possible only the one or a plurality of contaminating substances to be detected, e.g. hydrocarbons having a high mass number (>44 amu), are taken up on the cooled surface, whereas that proportion of the residual gas which does not form contamination and generally has a significantly higher partial pressure is not frozen out on the cooled surface.

In one preferred variant, the contaminating substance is accumulated in a gas-binding material and is subsequently desorbed from the gas-binding material for detection. In this case, too, the gas-binding material itself or a property of this material, e.g. the temperature thereof, can be chosen in such a way that the contaminating substance to be detected is taken up to a much higher degree than other substances.

In one advantageous variant, the contaminating substance is desorbed from the cooled surface and/or from the gas-binding material by irradiation with a laser and/or with an electron gun. In particular, light sources or electron sources with the aid of which the contaminating substance can be removed from the gas-binding material and/or the cooled surface by nonthermal desorption are appropriate for the irradiation.

In one advantageous variant, at least one component which out-gasses the contaminating substance, is arranged in the interior, and an out-gassing rate of the component is determined from the quantity of the contaminating substance that is determined by the residual gas analysis. Components composed of specific materials, e.g. soldered joints or adhesive joints, can outgas contaminating substances, wherein the contaminating substances can generally be unambiguously assigned to these materials. By determining the quantity of the contaminating substances, it is thus possible to draw conclusions about the outgassing rate of one or a plurality of components composed of identical material. In this case, the detection of the contaminating substances is preferably effected during a pause in operation of the EUV lithography apparatus in which no EUV radiation is present in the interior, in particular before the EUV light source is switched on or exposure operation is started. The residual gas composition also changes under the influence of the EUV radiation as a result of decomposition (cracking) of the contaminating substances.

In a particularly advantageous variant, for carrying out the residual gas analysis, a part of the residual gas of the EUV lithography apparatus is fed to a storage device of a residual gas analyzer that is spatially separate from the EUV lithography apparatus. In this case, the spatially separate residual gas analyzer need not necessarily be connected to the EUV lithography apparatus via a gas-tight connection, e.g. a hose, rather the residual gas from the interior can firstly be intermediately stored in a separable chamber of the EUV lithography apparatus and the chamber with the residual gas can subsequently be separated from the EUV lithography apparatus and be supplied to the residual gas analyzer. In this way, the residual gas analysis can be effected at any desired point in time, in particular including during the pauses in operation of the EUV lithography apparatus (that is to say offline).

In one advantageous variant, the contaminating substance is preferably ionized by irradiation with a laser prior to being stored in the storage device. The ionization is necessary if the contaminating substance is intended to be stored in an ion trap, wherein the ionization of the contaminating substance by a laser or, if appropriate, an electron gun is expedient since in this case it is possible to dispense with a heating wire for ionization.

Further features and advantages of the invention are apparent from the following description of exemplary embodiments of the invention, with reference to the figures of the drawing, which show details essential to the invention, and from the claims. The individual features can each be realized individually by themselves or as a plurality in any desired combination in a variant of the invention.

BRIEF DESCRIPTION OF THE DRAWINGS

Exemplary embodiments are illustrated in the schematic drawing and are explained in the description below. In the figures.

DETAILED DESCRIPTION OF EXEMPLARY EMBODIMENTS

Figure 1:
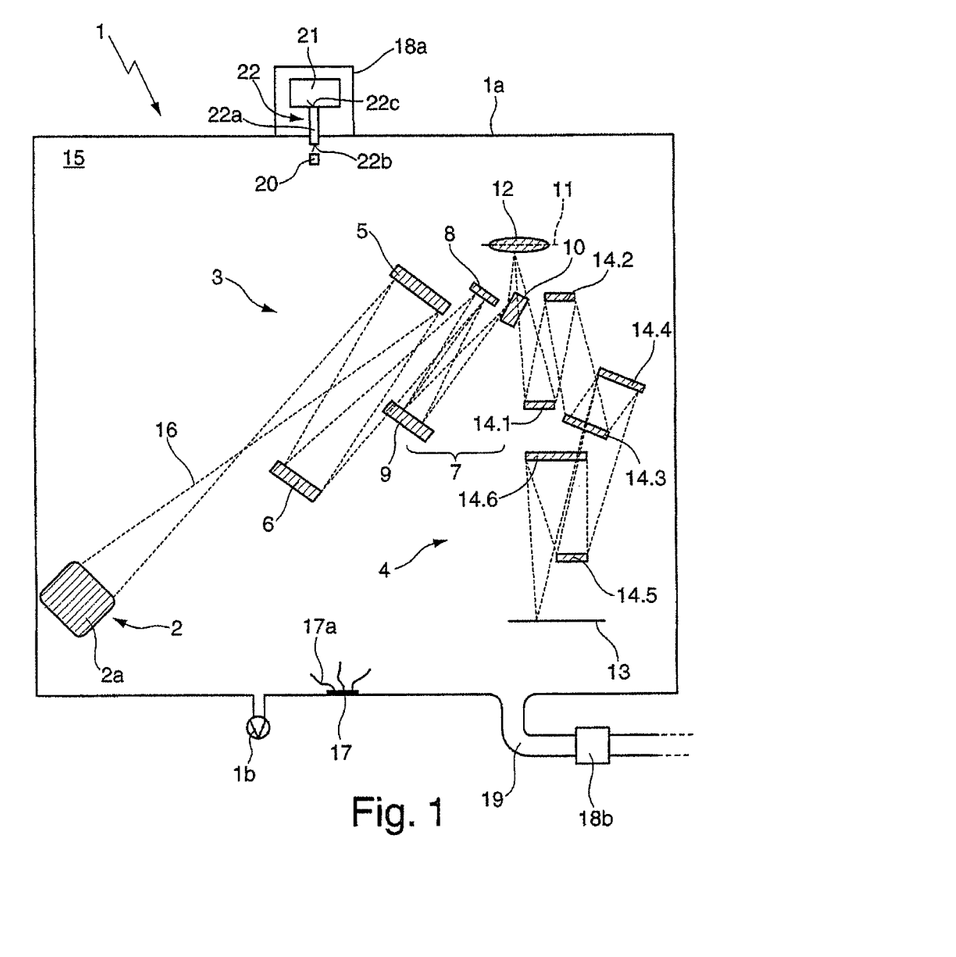
FIG. 1 shows a schematic illustration of an embodiment of an EUV lithography apparatus with two residual gas analyzers.

FIG. 1 shows a schematic illustration of an EUV lithography apparatus 1 having a housing 1a, to which a vacuum generating unit 1b (vacuum pump) is assigned. The housing 1a, in accordance with the optical function of the components arranged therein, is subdivided into three housing parts (not illustrated pictorially in FIG. 1), to be precise firstly into a first housing part having a light generating unit 2 comprising e.g. a plasma light source (not shown) and an EUV collector mirror 2a for focusing the illumination radiation.

Arranged in a second housing part adjacent thereto is the illumination system 3, which, following the beam course, has a mirror having field raster elements 5 and a mirror having pupil raster elements 6 as a light mixing device. A downstream group—acting as a telescope objective 7—of three mirrors, has a first and second mirror 8, 9, which are operated under normal incidence, and a third mirror 10, on which the light impinges under grazing incidence. The illumination system 3 generates an image field that is as homogeneous as possible in an object plane 11, in which is arranged a reticle 12 having a structure (not shown) to be imaged in demagnified fashion.

The structure arranged on the reticle 12 in the object plane 11 is imaged by a downstream projection system 4, which is arranged in a third housing part, onto an image plane 13, in which is situated a wafer having a photosensitive layer (not shown). The projection system 4 has six further mirrors 14.1 to 14.6 as reflective optical elements for the demagnifying imaging.

During operation of the EUV lithography apparatus, the vacuum generating unit 1b generates in the housing 1a a vacuum having a total pressure of typically more than $10^{-5}$ mbar and a hydrocarbon partial pressure of heavy hydrocarbons (above approximately 40 mass units) of approximately $10^{-12}$ mbar or less. The heavy hydrocarbons deposit as solids on the optical surfaces of the optical elements 2a, 5, 6, 8 to 10, 14.1 to 14.6 and are therefore referred to hereinafter as contaminating substances. In addition to heavy hydrocarbons, further contaminating gases can also occur in the interior 15 of the housing 1a, which contaminating gases can likewise be detected in the manner described further below.

The contaminating substances are typically released as gases from components which are arranged in the interior 15 of the housing 1a outside or in the beam path 16 and on which the EUV radiation impinges, e.g. through the wafer in the image plane 13. A component 17 (e.g. soldered joint) which is fitted to a partial region of the wall of the housing 2 and which releases a heavy hydrocarbon as contaminating substance 17a is shown by way of example in FIG. 1. The fitting of such components 17 which outgas contaminating substances 17a in the housing 1b cannot be completely prevented since many materials used in EUV lithography apparatuses cannot be overly heated.

In order to determine the proportion of the contaminating substances 17a produced by said component(s) 17 in the residual gas atmosphere of the interior 15 overall or individually for each contaminating substance, a first residual gas analyzer 18a is flanged to the housing 1a and a second residual gas analyzer 18b is arranged in a pump channel 19 outside the interior 15. The provision of a single residual gas analyzer 18a, 18b in the EUV lithography apparatus 1 generally suffices, but, if appropriate, two residual gas analyzers 18a, 18b of different types can be provided in order to be better able to detect different types of contaminations.

The first residual gas analyzer 18a is described in greater detail below; it has an ionization device 20 in the form of a glow wire (filament) for ionizing the contaminating substance 17a, a storage device 21 in the form of an ion trap for storing the contaminating substance 17a, and also a feeding device 22 for feeding the ions to the storage device 21. The ionization device 20 is caused to glow by the current required for generating the ions at the given pressure in the interior 15 and can e.g. also be operated in pulsed fashion. As an alternative or in addition, the ionization device 20 can also have an, in particular pulsed, laser that generates the ions using a focused laser beam.

The feeding device 22 is arranged directly adjacent to the ionization device 20 and has a vacuum tube, 22a with an ion optical unit (not shown) in order that the ions generated at the glow wire are fed to the storage device 21 in pulsed fashion. The feeding device has toward the interior a first controllable screen 22b, which ensures that a residual gas analysis can be carried out even at a high pressure of between 0.5 and 2 mbar in the interior 15 such as prevails e.g. during the exposure process. The screen 22b and, if appropriate, further cross sections and/or differential pump stages ensure that the residual gas pressure decreases to approximately $10^{-5}$ mbar toward the storage device 21 in order that a conventional residual gas analyzer can be used for the residual gas analysis. The pressure in the storage device 21 should also for this reason lie significantly below the pressure in the interior 15, in order to maintain the particle flow in the storage device. A second screen 22c is arranged at the exit of the vacuum tube 22a toward the storage device 21, said second screen only being opened if ions are accumulated in the storage device 21. The feeding device 22 thus enables the ions to be accumulated in the storage device 21 in a manner pulsed over time, whereby it is possible to significantly increase the measurement sensitivity during the residual gas analysis, which is illustrated in detail below with reference to FIG. 2.

Figure 2:
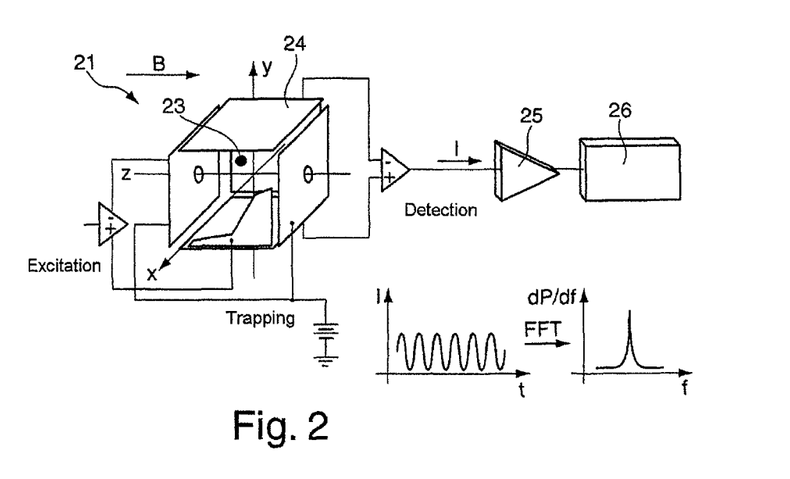
FIG. 2 shows a schematic illustration of an FT-ICR trap as storage device for a residual gas analyzer.

FIG. 2 illustrates the measurement principle in the storage device 21, which is embodied as an FT-ICR cell and in which ions 23 are trapped in a homogeneous magnetic field B that runs along the Z direction of an XYZ coordinate system and constrains the ions 23 injected into the FT-ICR trap 21 in the Z direction on orbital paths with a mass-dependent circulation frequency. The FT-ICR trap furthermore comprises six electrodes 24, to which an alternating electric field is applied perpendicular to the magnetic field B, and a cyclotron resonance is thereby generated. If the frequency of the alternating field irradiated in and the cyclotron angular frequency correspond, then the resonance situation occurs and the cyclotron radius of the relevant ion increases as a result of energy being taken up from the alternating field. These changes lead to measurable signals at the electrodes 24 of the FT-ICR trap 21, leading to a current flow 6 which is fed via an amplifier 25 to an FFT ("Fast Fourier Transform") spectrometer 26. The time-dependent current I received in the spectrometer 26 is Fourier transformed in order to obtain a mass spectrum dependent on the frequency f, which mass spectrum is illustrated at bottom right in FIG. 2.

Figure 3:
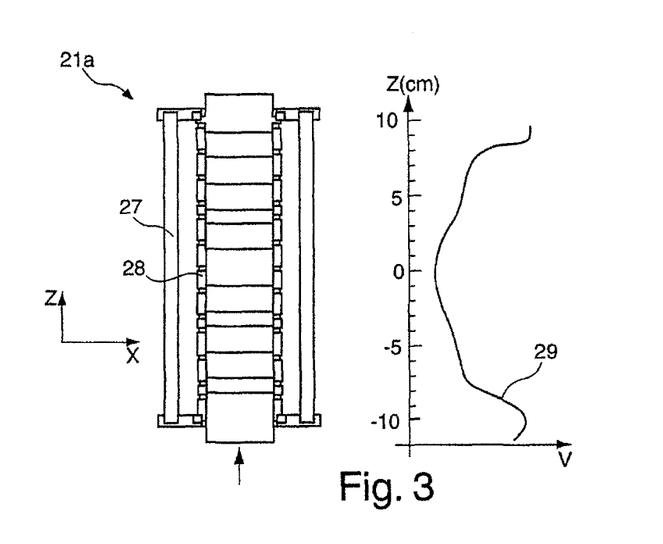
FIG. 3 shows a schematic illustration of a Penning trap as storage device for carrying out a mass-selective buffer gas cooling method.

As an alternative to the detection of contaminating substances by the accumulation of ions 23 in the FT-ICR cell 21, it is also possible to detect ions of a contaminating substance directly, that is to say without accumulation in a storage cell 21a in the form of an ion trap, which is explained below with reference to FIG. 3. FIG. 3 shows an ion trap 21a in the form of a cold trap of the Penning type such as is used in the experimental setup "ISOLTRAP" at Cern (http://isoltrap.web.cern.ch/isoltrap/). A temporally constant magnetic field is generated there with a superconducting magnet (not shown). A constant electric field is generated by a central ring electrode 27 and a plurality of individual electrodes 28 which are arranged in such a way that, along the axis of symmetry of the ion trap 21a, an electric field is established, the potential profile 29 of which in the Z direction is illustrated on the right in FIG. 3 and which has an outer and an inner potential well. With the so-called mass-selective buffer gas cooling method, in which a cooling gas, e.g. helium, is introduced into the ion trap 21a, it is possible, by combining a magnetron excitation using an electric dipole field and a cyclotron excitation using an electric quadrupole field, to effect a spatial separation of ions having a different mass-charge ratio even at a high residual pressure in the interior 15 of the EUV lithography apparatus 1, as is described more comprehensively e.g. in the dissertation by Dr. Alexander Kohl, "Direkte Massenbestimmung in der Bleigegend and Untersuchung eines Starkeffekts in der Penningfalle" ["Direct mass determination in the vicinity of lead and examination of a Stark effect in the Penning trap"], University of Heidelberg, 1999, which is incorporated by reference in the disclosure of this application. The storage cell 21a thus serves as a mass filter for spatially separating the contaminating substance from further substances in the residual gas atmosphere.

In the case of the ion traps 21, 21a, the ions need not necessarily be generated by a heating element, rather the ionization can e.g. also be effected by impact ionization, for example using an electron source. In addition to the ion traps 21, 21 a described above, it is also possible to use e.g. a Penning trap, a quadrupole ion trap or a Paul trap, a Linear trap, an Orbitrap, an EBIT or other types of ion traps for the detection of the contaminating substance. Moreover, it is possible, if appropriate, to arrange a conventional mass filter, e.g. a quadrupole mass filter, upstream of the ion traps 21, 21a in order to permit only ions having a predetermined mass-charge ratio to enter into said traps.

Figure 4A:
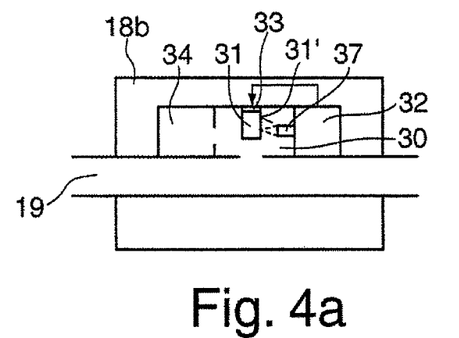
FIGS. 4a-c show schematic illustrations of a storage device with a cooling finger (a), and a gas-binding material (b, c) for the sorption and subsequent desorption of the contaminating substance.
Figure 4B:
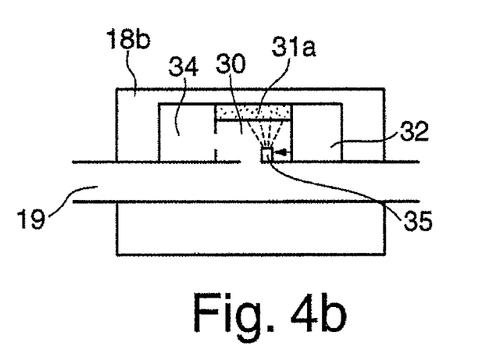
Figure 4C:
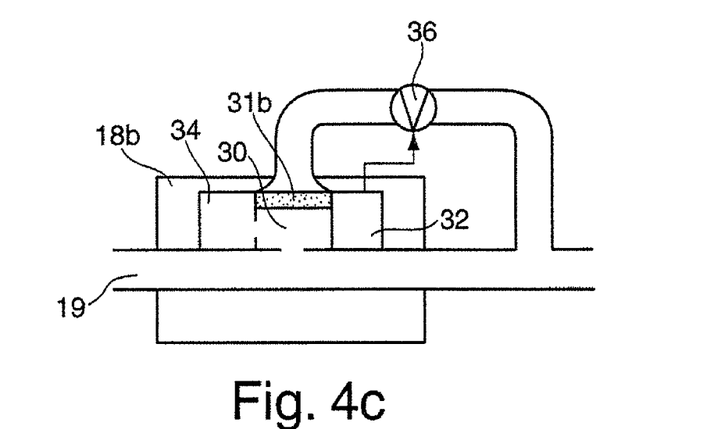

FIGS. 4a-c show examples of embodiments of the residual gas analyzer 18b from FIG. 1 arranged in the pump channel 19, in which embodiments the contaminating substance 17a is not ionized, but rather adsorbed or adsorbed, in order to accumulate it, such that, upon the subsequent desorption, a relatively large quantity of the contaminating substance is available for detection.

In FIG. 4a, a chamber 30 that is separable from the pump channel 19 using a controllable valve (not shown) is arranged in the residual gas analyzer, in which chamber a cooling finger 31 is fitted as a storage device. The cooling finger 31 is connected to a control device 32 which drives a combined cooling/heating element 33 in order to set the temperature at the surface 31' of the cooling finger 31 in such a way that at least one contaminating substance freezes out at said surface and can be accumulated in this way. In this case, the temperature of the cooling finger 31 can be set in such a way that only contaminating substances, in particular hydrocarbons having a mass number of greater than 44, condense on the surface 31', but not the background gas, typically helium, if appropriate also hydrogen, which does not contaminate the optical elements. For this purpose it is necessary for the temperature of the cooling finger 31 to remain greater than the condensation temperature of the respective background gas, that is to say above approximately 4.2 K in the case of helium and above approximately 20.3 K in the case of hydrogen.

After the accumulation of the contaminating substance, the valve between chamber 30 and pump channel 19 is closed and, in the small chamber volume, the cooling finger 31 is rapidly thawed or heated in a temperature controlled manner, such that the contaminating substance can be desorbed from the surface 31' and be fed to a conventional mass spectrometer 34, which detects the accumulated contaminating substance if appropriate together with further substances accumulated on the cooling finger. In addition or as an alternative to the heating of the cooling finger 31 with the combined cooling/heating element, it is also possible to desorb the contaminating substance or substances from the surface 31' by exposing the latter to the focused radiation from a laser 37, which can be operated in particular in pulsed fashion.

As an alternative to this, as is shown in FIG. 4b, the accumulation in the chamber 30 can also be effected at a gas-binding material 31a, e.g. at a zeolite, as a storage or absorber device. For the desorption of the contaminating substance from the gas-binding material 31a, the latter is bombarded by an electron gun 35 (and/or by a laser (not shown)). The electron gun 35 is activated with a control device 32 as soon as a sufficiently long period of time for accumulation has elapsed. The chamber 30 is then separated from the pump channel 19 in the manner described above, in order to detect the desorbed contaminating substance in a mass spectrometer 34.

While the accumulation takes place passively at the gas-binding material 31a in FIG. 4b, an active accumulation of the contaminating substance can also be effected (cf. FIG. 4c) by the residual gas being pumped, using a pump device 36, through a gas-binding material 31b, which serves as a filter and can likewise be composed of a zeolite since this material is porous enough to enable filtering. The pump device 36 can likewise be used for releasing the contaminating substance from the gas-binding material, where the pump device is operated in the opposite direction and with a higher capacity for the desorption, such that the contaminating substance is pumped into the chamber 30, where it can be detected in the manner described above in connection with FIGS. 4a, b.

The possibilities illustrated in FIGS. 4a-c for taking up the contaminating substance and subsequently desorbing it can also be combined. In particular, e.g. the adsorption/desorption can also be supported by cooling/heating of the gas-binding material 31a, 31b. Furthermore, if appropriate, the desorption can also be completely dispensed with if a direct, quantitative surface analysis of the gas-binding material 31a, 31b or of the cooling finger 31 is carried out e.g. using X-ray Photoemission Spectroscopy (XPS) or Time Of Flight Secondary Ion Mass Spectrometry (TOF-SIMS).

The residual gas analyzers 18a, 18b can be used to check whether the partial pressures of contaminating substances, in particular of heavy hydrocarbons, lie in the range of the specification, that is to say are $p(C_xH_y)<10^{-10}$ mbar or less for a typical EUV lithography apparatus 1. As a result of this, during the switch-on process, that is to say while a vacuum is being generated in the interior 15 of the housing 2, and before the EUV light generating unit 2 has actually been switched on for exposure operation, it is possible to perform an analysis of the residual gas in the interior 15 in the shortest possible time intervals, depending on the amount of contamination between 1 and 100 seconds, typically between 30 and 60 seconds. The light generating unit 2 is only activated as soon as the contaminations lie within the specification chosen, that is to say below a critical maximum value.

As a result of the analysis of the residual gas in the residual gas analyzers 18a, 18b, it is possible to deduce the quantity or the partial pressure of the contaminating substance 17a in the interior 15. From the quantity of the contaminating substance, it is also possible to make a statement about the outgassing rate of the component(s) 17 having a material that outgases the corresponding substance, the residual gas analysis for performing such a qualification generally being performed when exposure operation is not in progress.

The residual gas analyzer 18a need not necessarily be fitted to the EUV lithography apparatus, rather it can, if appropriate, also be arranged spatially at a distance from the apparatus and be connected e.g. via a hose to the interior 15, which can be heated, if appropriate. Moreover, it is not necessary for the residual gas analyzer to be connected to the EUV lithography apparatus, since a sample of the residual gas from the interior of the EUV lithography apparatus can be introduced into a gas-tight container that is transported to the residual gas analyzer in order to enable an offline analysis of the residual gas.

Further, materials which are used within storage devices 31, 31a, 31b for accumulation of contaminating substances have large specific surfaces as adsorption materials or are materials which can be used as a gettering agent. These materials are known materials which can also be used according to ISO 3529 I II for adsorption pumps or for getter pumps. Therefore beside the above mentioned zeolite also metals like tantalum, niobium, titanium, zirconium, and thorium and alloys like especially zirconium alloys are preferred materials for the storage devices 31, 31a, 31b.

To summarize, in the manner described above, it is possible to carry out a residual gas analysis for detecting and determining the quantity of contaminating substances in the interior 15 both during the switch-on phase and during exposure operation of the projection exposure apparatus, that is to say even at high background pressures of 0.5 mbar or more, wherein in particular even contaminating substances having extremely low partial pressures of $10^{-14}$ mbar or less can be detected.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An extreme-ultraviolet-lithography apparatus, comprising:
    a housing enclosing an interior,
    at least one reflective optical element arranged in the interior,
    a vacuum generating unit configured to generate a residual gas atmosphere in the interior, and
    a residual gas analyzer configured to detect at least one contaminating substance in the residual gas atmosphere and comprising a storage device with an ion trap configured to accumulate and store the contaminating substance continuously over a period of time and
    a mass spectrometer configured to detect the contaminating substance stored in the storage device either only intermittently during or after the period of time,
    wherein a total pressure of the residual gas in the interior is greater than $10^{-5}$ mbar, and a partial pressure of the contaminating substance in the interior is less than $10^{-9}$ mbar.

2. The lithography apparatus according to claim 1, wherein the storage device is configured to isolate the contaminating substance from other substances contained in the residual gas atmosphere.

3. The lithography apparatus according to claim 1, wherein the residual gas analyzer further comprises an ionization device configured to ionize the contaminating substance.

4. The lithography apparatus according to claim 1, wherein the ion trap is configured to detect the contaminating substance.

5. The lithography apparatus according to claim 1, wherein the residual gas analyzer further comprises a mass filter configured to separate the contaminating substance from other substances in the residual gas atmosphere.

6. The lithography apparatus according to claim 1, where the ion trap is selected from the group consisting of: a Fourier Transformation Ion Cyclotron Resonance trap, a Penning trap, a quadrupole ion trap, a Paul trap, a linear trap, an Orbitrap, an Electron Beam Ion Trap and a radio-frequency Buncher.

7. The lithography apparatus according to claim 1, wherein the storage device comprises a cooling unit configured to cool a surface for at least one of: freezing out and condensing the contaminating substance.

8. The lithography apparatus according to claim 7, wherein the storage device further comprises a heating unit configured to desorb the contaminating substance from the cooled surface.

9. The lithography apparatus according to claim 7, wherein the cooling unit is connected to a control device configured to set the temperature of the surface.

10. The lithography apparatus according to claim 7, further comprising an irradiation device configured to desorb the contaminating substance from the cooled surface.

11. The lithography apparatus according to claim 1, wherein the storage device configured to accumulate the contaminating substance comprises a gas-binding material.

12. The lithography apparatus according to claim 11, further comprising a pump device configured to pump the contaminating substance through the gas-binding material.

13. The lithography apparatus according to claim 11, further comprising an irradiation device configured to desorb the contaminating substance from the gas-binding material.

14. The lithography apparatus according to claim 1, wherein the storage device is arranged in a pump channel outside the interior.

15. The lithography apparatus according to claim 1, wherein the residual gas analyzer comprises an inlet configured to adjustably pulse-feed the contaminating substance into the storage device.

16. The lithography apparatus according to claim 1, wherein the partial pressure of the contaminating substance in the interior is less than $10^{-12}$ mbar.

17. The lithography apparatus according to claim 16, wherein the total pressure of the residual gas in the interior is greater than $10^{-4}$ mbar.

18. The lithography apparatus according to claim 1, wherein the total pressure of the residual gas in the interior is greater than $10^{-4}$ mbar.

19. A method for detecting at least one contaminating substance by residual gas analysis of a residual gas atmosphere of an extreme-ultraviolet-lithography apparatus having a housing defining an interior, and at least one reflective optical element arranged in the interior, comprising:

accumulating and storing the contaminating substance in a storage device having an ion trap for a continuous period of time, and performing the residual gas analysis by detecting the stored contaminating substance with a mass spectrometer either intermittently during or after the period of time, wherein a total pressure of the residual gas in the interior is greater than $10^{-5}$ mbar, and a partial pressure of the contaminating substance in the interior is less than $10^{-9}$ mbar.

20. The method according to claim 19, wherein the contaminating substance is accumulated in the storage device.

21. The method according to claim 19, further comprising isolating the contaminating substance from other substances contained in the residual gas atmosphere in the storage device.

22. The method according to claim 19, further comprising:
accumulating the contaminating substance on a cooled surface of the storage device, and
desorbing the accumulated contaminating substance from the cooled surface for detecting the contaminating substance.

23. The method according to claim 22, further comprising setting a temperature of the surface such that exclusively the contaminating substance is taken up on the cooled surface.

24. The method according to claim 22, wherein the contaminating substance is accumulated in a gas-binding material and is subsequently desorbed from the gas-binding material for detection.

25. The method according to claim 24, wherein said desorbing of the contaminating substance from the gas-binding material comprises irradiating the material with at least one of a laser and an electron gun.

26. The method according to claim 22, wherein said desorbing of the contaminating substance from the cooled surface comprises irradiating the cooled surface with at least one of a laser and an electron gun.

27. The method according to claim 19, further comprising:
arranging at least one component which outgasses the contaminating substance in the interior, and
determining an outgas sing rate of the component from a quantity of the contaminating substance that is determined by the residual gas analysis.

28. The method according to claim 19, wherein the residual gas analysis comprises feeding a part of the residual gas of the lithography apparatus to a storage device of a residual gas analyzer that is spatially separate from the lithography apparatus.

29. The method according to claim 28, further comprising ionizing the contaminating substance is by irradiation with a laser prior to being stored in the storage device.

* * * * *

UNITED STATES PATENT AND TRADEMARK OFFICE
CERTIFICATE OF CORRECTION

| | |
|---|---|
| PATENT NO. | : 8,953,145 B2 |
| APPLICATION NO. | : 13/035056 |
| DATED | : February 10, 2015 |
| INVENTOR(S) | : Kraus et al. |

It is certified that error appears in the above-identified patent and that said Letters Patent is hereby corrected as shown below:

In the specification

In column 1, line 42, change "alfa" to --alia--.

Signed and Sealed this
Twenty-eighth Day of June, 2016

Michelle K. Lee
*Director of the United States Patent and Trademark Office*